(12) United States Patent
Hallberg et al.

(10) Patent No.: US 12,283,142 B2
(45) Date of Patent: Apr. 22, 2025

(54) VEHICLE CONTROL SYSTEM FOR OPTIMIZING ENERGY CONSUMPTION

(71) Applicants: Ningbo Geely Automobile Research & Development Co., Ltd., Ningbo (CN); Zhejiang Geely Holding Group Co., Ltd., Zhejiang (CN)

(72) Inventors: Linus Hallberg, Säve (SE); Victor Judez, Gothenburg (SE)

(73) Assignees: Ningbo Geely Automobile Research & Dev. Co., Ltd., Ningbo (CN); ZHEJIANG GEELY HOLDING GROUP CO., LTD., Zhejiang (CN)

( * ) Notice: Subject to any disclaimer, the term of this patent is extended or adjusted under 35 U.S.C. 154(b) by 337 days.

(21) Appl. No.: 17/874,820

(22) Filed: Jul. 27, 2022

(65) Prior Publication Data
US 2022/0366739 A1    Nov. 17, 2022

Related U.S. Application Data

(63) Continuation of application No. PCT/CN2021/073823, filed on Jan. 26, 2021.

(30) Foreign Application Priority Data

Feb. 13, 2020    (EP) ..................... 20157238

(51) Int. Cl.
*H01M 10/625*    (2014.01)
*G07C 5/10*    (2006.01)
(Continued)

(52) U.S. Cl.
CPC .............. *G07C 5/10* (2013.01); *H01M 10/48* (2013.01); *H01M 10/613* (2015.04);
(Continued)

(58) Field of Classification Search
CPC .... B60L 58/16; G01M 13/021; G01R 31/392; G07C 5/0808; G07C 5/10; H01M 10/48;
(Continued)

(56) References Cited

U.S. PATENT DOCUMENTS 8,914,173 B2    12/2014  Biondo
2008/0228348 A1*    9/2008  Lee ................... G07C 5/008
340/457

(Continued)

FOREIGN PATENT DOCUMENTS

CN    102376995 A    3/2012
CN    102473974 A    5/2012
(Continued)

OTHER PUBLICATIONS

International Search Report from International Application No. PCT/CN2021/073823, Apr. 29, 2021, 3 pages.

*Primary Examiner* — Matthew J. Reda
(74) *Attorney, Agent, or Firm* — Tucker Ellis LLP (57) ABSTRACT

A vehicle control system for optimizing the energy consumption of a vehicle over the vehicle lifetime. The vehicle control system includes: a rechargeable electric battery; a mechanical component; and a processing circuitry configured to cause the vehicle control system to: determine a battery wear value of the rechargeable electric battery; determine a mechanical component wear value of the mechanical component; and determine a target temperature
(Continued)

value of the rechargeable electric battery based on the battery wear value and the mechanical component wear value.

15 Claims, 2 Drawing Sheets

(51) Int. Cl.
*H01M 10/48* (2006.01)
*H01M 10/613* (2014.01)
*H01M 10/615* (2014.01)
*H01M 10/63* (2014.01)
*G01M 13/021* (2019.01)
*G01R 31/392* (2019.01)

(52) U.S. Cl.
CPC ....... *H01M 10/615* (2015.04); *H01M 10/625* (2015.04); *H01M 10/63* (2015.04); *G01M 13/021* (2013.01); *G01R 31/392* (2019.01); *H01M 2220/20* (2013.01)

(58) Field of Classification Search
CPC ............. H01M 10/613; H01M 10/615; H01M 10/625; H01M 10/63; H01M 2220/20; Y02E 60/10
See application file for complete search history.

(56) References Cited

U.S. PATENT DOCUMENTS

| | | | |
|---|---|---|---|
| 2013/0103240 A1* | 4/2013 | Sato | H02J 7/007192 |
| | | | 701/22 |
| 2014/0210481 A1 | 7/2014 | Buford | |
| 2015/0066355 A1* | 3/2015 | Siegel | G01C 21/3492 |
| | | | 701/410 |
| 2015/0165919 A1 | 6/2015 | Hughes | |
| 2015/0367748 A1* | 12/2015 | West | B60L 50/16 |
| | | | 318/139 |
| 2016/0280201 A1* | 9/2016 | Choi | B60W 10/188 |
| 2017/0082188 A1* | 3/2017 | McKimpson | G01N 33/2888 |
| 2018/0326862 A1 | 11/2018 | Woo | |
| 2020/0160619 A1* | 5/2020 | Wang | G06N 20/00 |
| 2020/0287492 A1* | 9/2020 | Sega | H02P 6/185 |
| 2021/0049836 A1* | 2/2021 | Covington | G07C 5/085 |

FOREIGN PATENT DOCUMENTS

| | | |
|---|---|---|
| CN | 105842626 A | 8/2016 |
| CN | 108461860 A | 8/2018 |
| CN | 109086908 A | 12/2018 |
| DE | 102016221086 A1 | 4/2018 |
| DE | 112016006295 T5 | 11/2018 |

* cited by examiner

VEHICLE CONTROL SYSTEM FOR OPTIMIZING ENERGY CONSUMPTION

RELATED APPLICATION DATA

This application is a continuation of International Patent Application No. PCT/CN2021/073823, filed Jan. 26, 2021, which claims the benefit of European Patent Application No. 20157238.5, filed Feb. 13, 2020, the disclosures of which are incorporated herein by reference in their entireties.

TECHNICAL FIELD

The present disclosure relates to a vehicle control system for optimizing the energy consumption of a vehicle over the vehicle lifetime, wherein the vehicle control system comprises a rechargeable electric battery.

BACKGROUND

It is becoming more and more popular with electrified vehicles that are propelled purely by electric motors, or propelled by a combination of electric motors traditional combustion engines. Such electrified vehicles carry a rechargeable electric battery for electrifying the electric motors and other electric devices of the vehicle. A vehicle comprises multiple components and when designing a vehicle there is a desire that all components are worn in a way so that the components have a similar lifetime over the vehicle lifetime. Rechargeable electric batteries used in electrified vehicles will have different state of health when the vehicle is reaching its end of lifetime. Some vehicles will have a healthy rechargeable electric battery, even though components such as the vehicle engine and/or gearbox, but also e.g. interior components have reached the end of life status. During their lifetime, these vehicles have wasted a lot of energy on prolonging the lifetime of the rechargeable electric battery. For example, energy has been wasted on cooling the rechargeable electric battery to prolong the battery life of the rechargeable electric battery for no reason.

SUMMARY

A problem with current electrified vehicles is that energy is sometimes wasted on prolonging the lifetime of the rechargeable electric battery. There is a desire to optimize the energy consumption of a vehicle for e.g. lowering the energy consumption and to prolong the range when the vehicle is propelled purely on electricity.

It is an object of the present disclosure to mitigate, alleviate or eliminate one or more of the above-identified deficiencies and disadvantages in the prior art and solve at least the above mentioned problem. According to a first aspect there is provided a vehicle control system for optimizing the energy consumption of a vehicle over the vehicle lifetime, the vehicle control system comprises a rechargeable electric battery, a mechanical component, and a processing circuitry configured to cause the vehicle control system to determine a battery wear value of the rechargeable electric battery, determine a mechanical component wear value of the mechanical component and determine a target temperature value of the rechargeable electric battery based on the battery wear value and the mechanical component wear value.

An advantage with this first aspect is that with knowledge of a target temperature of the rechargeable electric battery, energy can be saved by maintaining the rechargeable electric battery at the target temperature.

According to some embodiments, the processing circuitry is further configured to cause the vehicle control system to determine a lifetime value of the rechargeable electric battery based on the current battery wear value and/or an expected battery wear value over time of the rechargeable electric battery.

An advantage with this embodiment is that the lifetime of the rechargeable electric battery can be determined at any time to continuously optimize the energy consumption of the vehicle.

According to some embodiments, the processing circuitry is further configured to cause the vehicle control system to determine a lifetime value of the mechanical component based on the current mechanical component wear value and/or an expected mechanical component wear value over time of the mechanical component.

An advantage with this embodiment is that the lifetime of the mechanical component can be determined at any time to continuously optimize the energy consumption of the vehicle.

According to some embodiments, the processing circuitry is further configured to cause the vehicle control system to determine the target temperature value to optimize the lifetime of the rechargeable electric battery to meet or exceed the lifetime value of the mechanical component.

An advantage with this determination of the target temperature is that the rechargeable electric battery can be optimized to be worn in accordance with the wear of the mechanical component so that the lifetime of the rechargeable electric battery match or exceed the lifetime value of the mechanical component.

According to some embodiments, the mechanical component wear value is dependent on a movement of at least a part of the mechanical component during operation of the vehicle.

An advantage with that the mechanical component wear value is dependent on a movement of at least a part of the mechanical component is that e.g. a measurement of the movement of the at least part can be made in order to obtain the mechanical component wear value.

According to some embodiments, the movement of the at least part of the mechanical component is a rotation movement and the mechanical component wear value is defined by the cumulative number of revolutions the at least part of the mechanical component has been rotating over time.

An advantage with that the mechanical component wear value is defined by the cumulative number of revolutions the at least part of the mechanical component has been rotating over time is that the mechanical component wear value can be obtained by e.g. measuring the number of revolutions the mechanical component is rotating.

According to some embodiments, the movement of the at least part of the mechanical component is a rotation movement and the mechanical component wear value is defined by the cumulative torque of the at least part of the mechanical component over time.

An advantage with that the mechanical component wear value is defined by the cumulative torque of the part of the mechanical component over time is that the mechanical component wear value can be determined based on e.g. the load and or the power used for moving and/or rotating the mechanical component.

According to some embodiments, the mechanical component is any of a gearbox, a shaft, a steering linkage component, a suspension component, an engine, an electrical motor or a brake component.

An advantage with this embodiment is that a mechanical component wear value can be determined for a plurality of mechanical components, each having at least a part that is moving during operation of the vehicle.

According to some embodiments, the mechanical component is a gearbox and the mechanical component wear value of the gearbox is dependent on the usage of the gearbox.

An advantage with this embodiment is that the rechargeable electric battery can be optimized to be worn in accordance with the wear of the gearbox.

According to some embodiments, the usage of the gearbox is defined by the cumulative number of revolutions over time, and the cumulative torque over time, of at least a part of the gearbox.

An advantage with this embodiment is that measurements of the number of revolutions and the torque of the at least part of the gearbox, e.g. one of the gearwheels, can be obtained to determine the usage, and the mechanical component wear value, of the gearbox.

According to some embodiments, the vehicle control system further comprises a temperature management system for the rechargeable electric battery configured to cool or heat the rechargeable electric battery dependent on the target temperature value.

An advantage with the temperature management system is that the rechargeable electric battery can be maintained at a temperature according to the target temperature value for optimizing the energy consumption of a vehicle over the vehicle lifetime.

According to a second aspect there is provided a method for optimizing the energy consumption of a vehicle over the vehicle lifetime, the method comprising determining a battery wear value of the rechargeable electric battery, determining a mechanical component wear value of the mechanical component, and determining a target temperature value of the rechargeable electric battery based on the battery wear value and the mechanical component wear value.

An advantage with this second aspect is that with knowledge of a target temperature of the rechargeable electric battery, energy can be saved by maintaining the rechargeable electric battery at the target temperature.

According to some embodiments, the method further comprises determining a lifetime value of the rechargeable electric battery based on the current battery wear value and/or an expected battery wear value over time of the rechargeable electric battery, and determining a lifetime value of the mechanical component based on the current mechanical component wear value and/or an expected mechanical component wear value over time of the mechanical component.

An advantage with this embodiment is that the lifetime of the rechargeable electric battery and the lifetime of the mechanical component can be determined at any time to continuously optimize the energy consumption of the vehicle.

According to some embodiments, the method further comprises determining the target temperature value to optimize the lifetime of the rechargeable electric battery to meet or exceed the lifetime value of the mechanical component.

An advantage with this determination of the target temperature is that the rechargeable electric battery can be optimized to be worn in accordance with the wear of the mechanical component.

According to a third aspect there is provided a computer program product comprising a non-transitory computer readable medium, having thereon a computer program comprising program instructions, the computer program being loadable into a processing circuitry and configured to cause execution of the method when the computer program is run by the at least one processing circuitry.

Effects and features of the second and third aspects are to a large extent analogous to those described above in connection with the first aspect. Embodiments mentioned in relation to the first aspect are largely compatible with the second and third aspects.

The present disclosure will become apparent from the detailed description given below. The detailed description and specific examples disclose preferred embodiments of the disclosure by way of illustration only. Those skilled in the art understand from guidance in the detailed description that changes and modifications may be made within the scope of the disclosure.

Hence, it is to be understood that the herein disclosed disclosure is not limited to the particular component parts of the device described or steps of the methods described since such device and method may vary. It is also to be understood that the terminology used herein is for purpose of describing particular embodiments only, and is not intended to be limiting. It should be noted that, as used in the specification and the appended claim, the articles "a", "an", "the", and "said" are intended to mean that there are one or more of the elements unless the context explicitly dictates otherwise. Thus, for example, reference to "a unit" or "the unit" may include several devices, and the like. Furthermore, the words "comprising", "including", "containing" and similar wordings does not exclude other elements or steps.

BRIEF DESCRIPTION OF THE DRAWINGS

The above objects, as well as additional objects, features and advantages of the present disclosure, will be more fully appreciated by reference to the following illustrative and non-limiting detailed description of example embodiments of the present disclosure, when taken in conjunction with the accompanying drawings.

DETAILED DESCRIPTION

The present disclosure will now be described with reference to the accompanying drawings, in which preferred example embodiments of the disclosure are shown. The disclosure may, however, be embodied in other forms and should not be construed as limited to the herein disclosed embodiments. The disclosed embodiments are provided to fully convey the scope of the disclosure to the skilled person.

The performance and the lifetime of a battery is affected by the temperature of the battery. Most batteries have an optimal operation temperature. A common optimal operation temperature is around 20 degrees Celsius, or 68 degrees Fahrenheit. Batteries that are used indoor does usually not suffer from different surrounding temperatures. Indoor temperature is usually around the optimum operation temperature. Batteries that are used in devices that are outdoors are however heated up or cooled down due to the weather that affects the surrounding temperature. The performance of a battery drops at low temperatures. This means that batteries used in cold environments such as in a vehicle when the weather is cold are affected by the lower temperature.

Electrified vehicles that are pure electric or semi electric, such as hybrid or plug-in hybrid vehicles are often equipped with a rechargeable electric battery. For a vehicle, the temperature of the rechargeable electric battery is dependent on factors such as the ambient temperature, the driving style, the driving speed, the cooling or heating of the battery, and the road conditions, e.g. if it is uphill or downhill. Electrified vehicles are dependent on the performance and lifetime of the rechargeable electric battery. With a cold rechargeable electric battery, it can be impossible to obtain nominal power from the rechargeable electric battery that is affecting the driving performance. Today one way to avoid a drop in battery performance, during low temperatures in the rechargeable electric battery, is to heat up the rechargeable electric battery. There are also occasions when a rechargeable electric battery needs to be cooled down and another way to avoid a drop in battery performance, during high temperatures in the rechargeable electric battery, is then to cool down the rechargeable electric battery.

The heating up or cooling down of the rechargeable electric battery to aim at the optimal operating temperature will also prolong the lifetime of the rechargeable electric battery. A target operation temperature of the rechargeable electric battery can optimized in order to prolong the lifetime of the rechargeable electric battery.

Hence, for electrified vehicles that are dependent on the performance of the rechargeable electric battery, the heating up or cooling down the rechargeable electric battery to maintain the rechargeable electric battery at a certain temperature is of particular importance both for the battery performance and for prolonging the lifetime of the rechargeable electric battery.

However, a problem with current electrified vehicles is that energy is often wasted on prolonging the lifetime of the rechargeable electric battery. A vehicle comprises multiple components and when designing a vehicle there is a desire that all components are worn in way so that the components have a similar lifetime over the vehicle lifetime. Rechargeable electric batteries used in electrified vehicles will have different state of health when the vehicle is reaching its end of lifetime. Some vehicles will have a healthy rechargeable electric battery, even though components such as the vehicle engine and/or gearbox, but also e.g. interior components have reached the end of life status. During their lifetime, these vehicles have wasted a lot of energy on prolonging the lifetime of the rechargeable electric battery. For example, energy has been wasted on cooling or heating the rechargeable electric battery to prolong the battery life of the rechargeable electric battery for no reason.

There is a desire to optimize the energy consumption of a vehicle for e.g. lowering the energy consumption and to prolong the range in particular when the vehicle is propelled purely on electricity.

Figure 1:
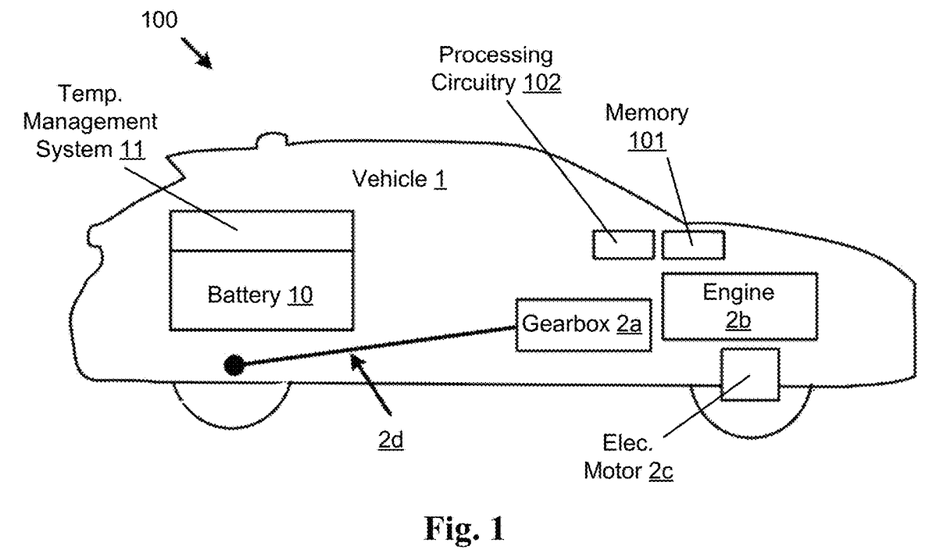
FIG. 1 illustrates an example overview of the vehicle control system according to an embodiment of the present disclosure.

It is an object of the present disclosure to mitigate, alleviate or eliminate one or more of the above-identified deficiencies and disadvantages in the prior art and solve at least the above-mentioned problem FIG. 1 illustrates an example overview of the vehicle control system according to an embodiment of the present disclosure.

The first aspect of this disclosure shows a vehicle control system 100 for optimizing the energy consumption of a vehicle 1 over the vehicle lifetime. The vehicle control system 100 comprises a rechargeable electric battery 10. The rechargeable electric battery 10 is typically a high voltage battery used for electrifying electric motors to propel the vehicle 1.

The vehicle control system 100 further comprises a mechanical component 2a, 2b, 2c, 2d. According to some embodiments, the mechanical component is any of a gearbox, a shaft, a steering linkage component, a suspension component, an engine, an electrical motor or a brake component. FIG. 1 illustrates example mechanical components 2a, 2b, 2c, 2d. In the example illustration in FIG. 1 the mechanical component 2a is a gearbox, the mechanical component 2b is an engine, the mechanical component 2c is an electrical motor and the mechanical component 2d is a shaft.

The vehicle control system 100 further comprises a processing circuitry 102 configured to cause the vehicle control system 100 to determine a battery wear value of the rechargeable electric battery 10, determine a mechanical component wear value of the mechanical component 2a, 2b, 2c, 2d and determine a target temperature value of the rechargeable electric battery 10 based on the battery wear value and the mechanical component wear value.

According to some embodiments the battery wear value is determined by measuring the internal resistance of the rechargeable electric battery 10. According to some embodiments the battery wear value is determined by measuring the State of Health, SoH, of the rechargeable electric battery 10. According to some embodiments the State of Health, SoH, of the rechargeable electric battery 10 is determined by at least any of, or a combination of, the internal resistance of the rechargeable electric battery 10, the capacity of the rechargeable electric battery 10, the voltage of the rechargeable electric battery 10, the age of the rechargeable electric battery 10, the total energy charged to the rechargeable electric battery 10, and/or the total energy discharged from the rechargeable electric battery 10.

According to some embodiments the battery wear value is determined over a predetermined time period. According to some embodiments the processing circuitry 102 is configured to continuously determine the battery wear value and store the determined the battery wear value together with a time stamp in a memory 101. According to some embodiments the battery wear value is an average value based on a plurality of battery wear values determined over a predetermined time period. In an example the battery wear value is determined over the last 24 hours.

According to some embodiments the mechanical component wear value is determined based the usage of the mechanical component 2a, 2b, 2c, 2d. According to some embodiments the mechanical component wear value is determined based on the age of the mechanical component 2a, 2b, 2c, 2d. According to some embodiments the mechanical component wear value is determined based on the distance travelled by the vehicle after installation of the mechanical component 2a, 2b, 2c, 2d in the vehicle. According to some embodiments the mechanical component wear value is determined based on the temperature surrounding the vehicle comprising the mechanical component 2a, 2b, 2c, 2d over a predetermined time or since the time of installation of the mechanical component 2a, 2b, 2c, 2d in the vehicle.

According to some embodiments the mechanical component wear value is determined over a predetermined time period. According to some embodiments the processing circuitry 102 is configured to continuously determine the mechanical component wear value and store the determined mechanical component wear value together with a time stamp in a memory 101. According to some embodiments the mechanical component wear value is an average value based on a plurality mechanical component wear values determined over a predetermined time period. In an example the mechanical component wear value is determined over the last 24 hours.

According to some embodiments the mechanical component wear value is dependent on a movement of at least a part of the mechanical component during operation of the vehicle 1. According to some embodiments the movement of the part of the mechanical component is measured by a movement sensor 12. According to some embodiments the movement sensor 12 is configured to determine a relative movement of the part of the mechanical component 2a, 2b, 2c, 2d by an accelerometer sensor or a gyro sensor. According to some embodiments the movement sensor 12 is configured to determine a movement of the part of the mechanical component 2a, 2b, 2c, 2d by a counting the number of revolutions per minute that the part of the mechanical component 2a, 2b, 2c, 2d is rotating. According to some embodiments the movement sensor 12 is any of a tachometer, a revolution counter, or a Revolutions Per Minute gauge. According to some embodiments the movement sensor 12 is an optical sensor configured to obtain an image of the rotating part of the mechanical component 2a, 2b, 2c, 2d. According to some embodiments the movement sensor 12 is an optical sensor configured to obtain an image of a mark at the rotating part of the mechanical component 2a, 2b, 2c, 2d which causes an electronic pulse due to a change of voltage state of the optical sensor, once per revolution each time when the image of the mark at the rotating part of the mechanical component 2a, 2b, 2c, 2d is obtained by the optical sensor.

Figure 2:
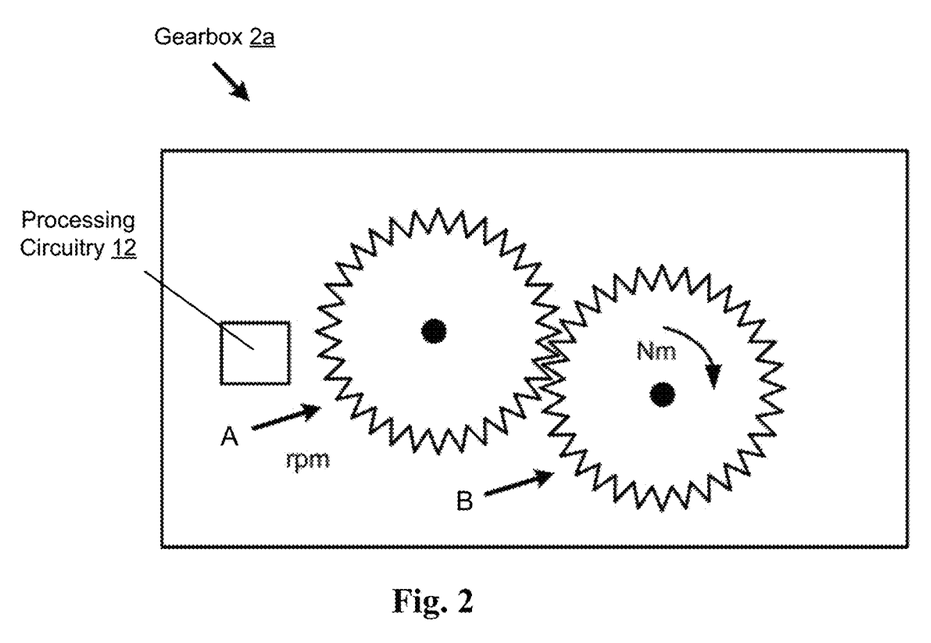
FIG. 2 illustrates an example mechanical component with movable parts according to an embodiment of the present disclosure.

FIG. 2 illustrates and example embodiment of a gearbox 2a. In the example as illustrated in FIG. 2, a gearwheel A is rotating with a certain number of revolutions per minute, rpm, during use of the gearbox 2a. According to some embodiments the mechanical component wear value is dependent on the torque of the at least part of the mechanical component 2a, 2b, 2c, 2d. According to some embodiments the processing circuitry 102 is configured to continuously calculate the torque of the at least part of the mechanical component 2a, 2b, 2c, 2d. According to some embodiment the processing circuitry 102 is configured to continuously calculate the torque of the at least part of the mechanical component 2a, 2b, 2c, 2d using predetermined physical data associated with the mechanical component 2a, 2b, 2c, 2d stored in the memory 101 and/or obtained data from the movement sensor 12.

According to some embodiments the mechanical component wear value is based on a so-called duty value determined by the number of revolutions times the torque. According to some embodiments the mechanical component wear value is based on a duty value determined by the number of revolutions times an n:th power of the torque. In an example n=3, i.e. "duty value=rotation×torque$^3$". In the example, it becomes clear that according to some embodiments the torque influences the mechanical component wear value more than the revolutions per minute. According to some embodiments the mechanical component wear value is based on a duty value determined by the cumulative number of revolutions times the torque. In the illustration in FIG. 2, the torque, Nm, of the gearwheel "B" is used for determining the mechanical component wear value of the gearbox 2a.

According to some embodiments the target temperature value of the rechargeable electric battery 10 is determined based on the battery wear value and the mechanical component wear value. According to some embodiments the processing circuitry 102 is further configured to cause the vehicle control system 100 to determine a first and a second target temperature value dependent on a first and a second drive mode of the vehicle. According to some embodiments the drive mode of the vehicle is dependent on if the vehicle is stationary or moving. In an example when the vehicle 1 is parked, the vehicle is set to a first drive mode. In an example when the vehicle 1 is in eco-driving the vehicle is set to a second drive mode. According to some embodiments the processing circuitry 102 is further configured to cause the vehicle control system 100 to determine the target temperature value of the rechargeable electric battery 10 based on the battery wear value, the mechanical component wear value and the driving mode of the vehicle 1.

The inventors have realized that in order to optimize the energy consumption of the vehicle 1, energy should not be wasted on prolonging the battery life of the rechargeable electric battery 10 if the lifetime of the rechargeable electric battery 10 then will be longer than the lifetime of the vehicle 1. Instead, it is desired to only spend necessary energy sufficient to provide cooling, or heating, of the rechargeable electric battery 10 to a target temperature that will cause the lifetime of the rechargeable electric battery 10 to meet the lifetime of the vehicle 1.

An advantage with the battery wear value and the mechanical component wear value is that by quantifying the wear of the rechargeable electric battery 10 and the wear of the mechanical component 2a, 2b, 2c, 2d, it is possible to determine the expected lifetime of the rechargeable electric battery 10 and the lifetime of the mechanical component 2a, 2b, 2c, 2d respectively.

According to some embodiments the target temperature value of the rechargeable electric battery 10 is the optimized temperature value that will cause the lifetime of the rechargeable electric battery 10 to meet the lifetime of the vehicle 1.

An advantage with this first aspect is that with knowledge of a target temperature of the rechargeable electric battery 10, energy can be saved by maintaining the rechargeable electric battery 10 at the target temperature.

According to some embodiments, the processing circuitry 102 is further configured to cause the vehicle control system 100 to determine a lifetime value of the rechargeable electric battery 10 based on the current battery wear value and/or an expected battery wear value over time of the rechargeable electric battery 10.

According to some embodiments the lifetime value is the number of days or years the rechargeable electric battery 10 is predicted to be in an operable condition. According to some embodiments the expected battery wear value over time is predicted based on the current battery wear value. According to some embodiments the expected battery wear value over time is predicted based on the current battery wear value in comparison with a predetermined battery wear value over time. In an example the expected battery wear value over time is estimated based on predetermined data associated with the operation of the rechargeable electric battery 10, stored in a memory 101. According to some embodiments the expected battery wear value is a predetermined value based on a function defined by a target temperature value over time.

An advantage with this embodiment is that the lifetime of the rechargeable electric battery 10 can be determined at any time to continuously optimize the energy consumption of the vehicle 1.

According to some embodiments, the processing circuitry 102 is further configured to cause the vehicle control system 100 to determine a lifetime value of the mechanical component 2a, 2b, 2c, 2d based on the current mechanical component wear value and/or an expected mechanical component wear value over time of the mechanical component 2a, 2b, 2c, 2d. According to some embodiments the lifetime value is the number of days or years the mechanical component 2a, 2b, 2c, 2d is predicted to be in an operable condition. According to some embodiments the expected mechanical component wear value over time is predicted based on the current mechanical component wear value. According to some embodiments the expected mechanical component wear value over time is predicted based on the current mechanical component wear value in comparison with a predetermined mechanical component wear value over time. In an example the expected mechanical component wear value over time is estimated based on predetermined data associated with the operation of the mechanical component 2a, 2b, 2c, 2d, stored in a memory 101.

According to some embodiments the mechanical component wear value of the mechanical component 2a, 2b, 2c, 2d is stored in the memory 101 and used for determining the expected mechanical component wear value over time of the mechanical component 2a, 2b, 2c, 2d. According to some embodiments the mechanical component wear value of the mechanical component 2a, 2b, 2c, 2d is stored in the memory 101 and used for controlling operation of the mechanical component 2a, 2b, 2c, 2d in order to prolong or shorten the life time value of the mechanical component 2a, 2b, 2c, 2d.

An advantage with this embodiment is that the lifetime of the mechanical component can be determined at any time to continuously optimize the energy consumption of the vehicle.

According to some embodiments, the processing circuitry 102 is further configured to cause the vehicle control system 100 to determine the target temperature value to optimize the lifetime of the rechargeable electric battery 10 to meet or exceed the lifetime value of the mechanical component 2a, 2b, 2c, 2d.

According to some embodiments the processing circuitry 102 is further configured to cause the vehicle control system 100 to continuously determine the target temperature value to continuously optimize the lifetime of the rechargeable electric battery 10 to meet or exceed the lifetime value of the mechanical component 2a, 2b, 2c, 2d by continuously cooling or heating the rechargeable electric battery 10.

According to some embodiments the determination of the target temperature value is based on predetermined data associated with the operation of the rechargeable electric battery 10, stored in a memory 101. According to some embodiments the determination of the target temperature value is based on comparing different predetermined target temperature data associated with the operation of the rechargeable electric battery 10 in order to meet or exceed the lifetime value of the mechanical component 2a, 2b, 2c, 2d. According to some embodiments the lifetime of the rechargeable electric battery 10 is a predetermined value based on a function defined by a target temperature value over time. In an example a change of the target temperature value causes a change of the lifetime of the rechargeable electric battery 10.

An advantage with this determination of the target temperature is that the rechargeable electric battery 10 can be optimized to be worn in accordance with the wear of the mechanical component 2a, 2b, 2c, 2d.

According to some embodiments, the mechanical component wear value is dependent on a movement of at least a part of the mechanical component 2a, 2b, 2c, 2d during operation of the vehicle 1. According to some embodiments the mechanical component 2a, 2b, 2c, 2d comprising a plurality of moving parts, and the mechanical component wear value is dependent on a movement of at least two moving parts of the mechanical component 2a, 2b, 2c, 2d. In an example, a gearbox may comprise a plurality of gearwheels, and the mechanical component wear value of the gearbox is dependent on two of the plurality of gearwheels. According to some embodiments the mechanical component wear value is determined using predetermined values defining the lifetime of different movable parts of the mechanical component 2a, 2b, 2c, 2d.

An advantage with that the mechanical component wear value is dependent on a movement of at least a part of the mechanical component 2a, 2b, 2c, 2d is that e.g. a measurement of the movement of the at least part can be made in order to obtain the mechanical component wear value of the mechanical component 2a, 2b, 2c, 2d.

According to some embodiments, the movement of the at least part of the mechanical component 2a, 2b, 2c, 2d is a rotation movement and the mechanical component wear value is defined by the cumulative number of revolutions the part of the mechanical component 2a, 2b, 2c, 2d has been rotating over time.

An advantage with that the mechanical component wear value is defined by the cumulative number of revolutions the part of the mechanical component has been rotating over time is that the mechanical component wear value can be obtained by e.g. measuring the number of revolutions the part of the mechanical component is rotating.

According to some embodiments the processing circuitry 102 is configured to obtain, from the memory 101, predetermined lifetime data defining the lifetime of the mechanical component 2a, 2b, 2c, 2d dependent on the cumulative number of revolutions of the part of the mechanical component 2a, 2b, 2c, 2d for determining the component wear value.

According to some embodiments, the movement of the part of the mechanical component 2a, 2b, 2c, 2d is a rotation movement and the mechanical component wear value is defined by the cumulative torque of the part of the mechanical component 2a, 2b, 2c, 2d over time.

An advantage with that the mechanical component wear value is defined by the cumulative torque of the part of the mechanical component 2a, 2b, 2c, 2d over time is that the mechanical component wear value can be determined based on e.g. the load and/or the power used for moving and/or rotating the mechanical component 2a, 2b, 2c, 2d.

According to some embodiments the processing circuitry 102 is configured to obtain, from the memory 101, predetermined lifetime data defining the lifetime of the mechanical component 2a, 2b, 2c, 2d dependent on the cumulative torque of the part of the mechanical component 2a, 2b, 2c, 2d over time for determining the component wear value.

According to some embodiments, the mechanical component 2a, 2b, 2c, 2d is any of a gearbox, a shaft, a steering linkage component, a suspension component, an engine, an electrical motor or a brake component. According to some embodiments, the mechanical component 2a, 2b, 2c, 2d is any of a generator, a powertrain, a universal joint, a cylinder, a crankshaft, a camshaft, a valve opener, a pedal, a clutch, an automatic gearbox.

According to some embodiments, the mechanical component wear value is determined based on a plurality of mechanical components 2a, 2b, 2c, 2d. According to some embodiments, the mechanical component wear value is an average value based on at least a first mechanical component wear value and a second mechanical component wear value. In an example the first mechanical component wear value is the mechanical component wear value of the front left electric motor and the second mechanical component wear value is the mechanical component wear value of the front right electric motor.

An advantage with this embodiment is that a mechanical component wear value can be determined for a plurality of mechanical components that each having at least a part that is moving during operation of the vehicle.

According to some embodiments, the mechanical component 2a, 2b, 2c, 2d is a gearbox and the mechanical component wear value of the gearbox is dependent on the usage of the gearbox. In an example, when the gearbox of a vehicle has reached the end of life it may not mean the end of life for the vehicle but this component an example of an expensive mechanical component that can be used for defining the lifetime of the vehicle 1.

According to an example the mechanical component is a part of a gearbox. According to some embodiments the mechanical component is a gearwheel of a gearbox. In an example, the mechanical component wear value can be determined for each gearwheel of a gearbox. In an example the lifetime of each gearwheel can be determined based on the mechanical component wear value for each gearwheel. According to some embodiments the mechanical component wear value for each gearwheel is stored in the memory 101 and used for controlling the operation of the vehicle. In an example the mechanical component wear value is used for e.g. controlling the shift of gear of an automatic gearbox in order to prevent or reduce damage of the gearwheel. An advantage with this embodiment is that the rechargeable electric battery can be optimized to be worn in accordance with the wear of the gearbox.

According to some embodiments, the usage of the gearbox is defined by the cumulative number of revolutions over time, and the cumulative torque over time, of at least a part of the gearbox. In an example the part of the gearbox is one of the gearwheels. According to some embodiments a plurality of parts of the gearbox are used for defining the usage of the gearbox, and the mechanical component wear value of the gearbox.

An advantage with this embodiment is that measurements of the number of revolutions and the torque of the part of the gearbox, e.g. of one of the gearwheels, can be obtained to determine the usage, and the mechanical component wear value, of the gearbox.

According to some embodiments, the vehicle control system 100 further comprises a temperature management system 11 for the rechargeable electric battery 10 configured to cool or heat the rechargeable electric battery 10 dependent on the target temperature value.

According to some embodiments the processing circuitry 102 is configured to determine the target temperature value and control the temperature of the rechargeable electric battery 10, via the temperature management system 11, to be cooled or heated to the determined target temperature value. According to some embodiments the temperature management system 11 further comprises at least one temperature sensor, for obtaining the temperature of the rechargeable electric battery 10. In an example the temperature sensor obtains the temperature of the rechargeable electric battery 10 and the obtained temperature is 16 degrees centigrade. In the example the determined target temperature value is determined to 23 degrees centigrade. In the example the processing circuitry 102 controls the temperature of the rechargeable electric battery 10 via the temperature management system 11 that starts to heat the rechargeable electric battery 10 to the determined target temperature value of 23 degrees centigrade.

According to some embodiments the temperature management system 11 comprises a heating device and/or a cooling device configured to heat or cool the rechargeable electric battery 10. In an example the heating device is any of an electric heating element, a hot air outlet, a chemical heating element or a pipe system configured to circulate hot liquid in/or around the rechargeable electric battery 10. In an example the cooling device is any of a cold air outlet, a chemical cooling element or a pipe system configured to circulate cold liquid in/or around the rechargeable electric battery 10.

In an example the temperature management system 11 is integrated with the rechargeable electric battery 10 as illustrated in FIG. 1. In an example the temperature management system 11 is configured to be thermally connectable with the rechargeable electric battery 10.

An advantage with the temperature management system is that the rechargeable electric battery can be maintained at a temperature according to the target temperature value for optimizing the energy consumption of a vehicle over the vehicle lifetime.

Figure 3:
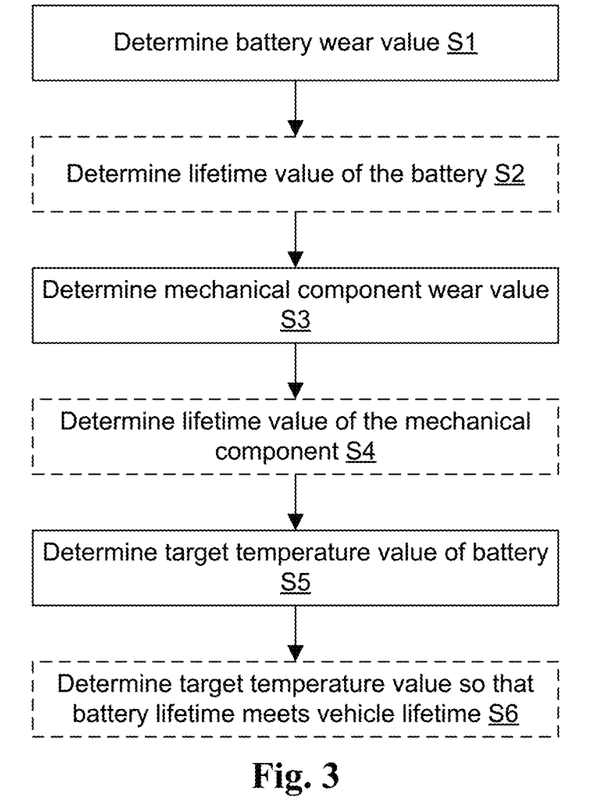
FIG. 3 illustrates a flow chart of the method steps according to the second aspect of the disclosure.

The second aspect of this disclosure shows a method for optimizing the energy consumption of a vehicle 1 over the vehicle lifetime. FIG. 3 illustrates a flow chart of the method steps according to the second aspect of the disclosure. The method comprising the step S1 determining a battery wear value of the rechargeable electric battery 10, the step S3 determining a mechanical component wear value of the mechanical component 2a, 2b, 2c, 2d, and the step S5 determining a target temperature value of the rechargeable electric battery 10 based on the battery wear value and the mechanical component wear value.

An advantage with this second aspect is that with knowledge of a target temperature of the rechargeable electric battery, energy can be saved by maintaining the rechargeable electric battery at the target temperature.

According to some embodiments, the method further comprises the step S2 determining a lifetime value of the rechargeable electric battery 10 based on the current battery wear value and/or an expected battery wear value over time of the rechargeable electric battery 10, and the step S4 determining a lifetime value of the mechanical component 2a, 2b, 2c, 2d based on the current mechanical component wear value and/or an expected mechanical component wear value over time of the mechanical component 2a, 2b, 2c, 2d.

An advantage with this embodiment is that the lifetime of the rechargeable electric battery and the lifetime of the mechanical component can be determined at any time to continuously optimize the energy consumption of the vehicle.

According to some embodiments, the method further comprises the step S6 determining the target temperature value to optimize the lifetime of the rechargeable electric battery 10 to meet or exceed the lifetime value of the mechanical component 2a, 2b, 2c, 2d.

An advantage with this determination of the target temperature is that the rechargeable electric battery can be optimized to be worn in accordance with the wear of the mechanical component.

Figure 4:
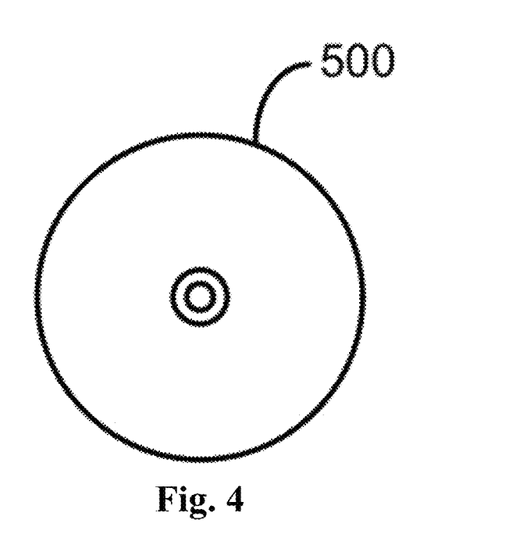
FIG. 4 illustrates a computer program product according to the third aspect of the disclosure.

The third aspect of this disclosure shows a computer program product the second aspect comprising a non-transitory computer readable medium, having thereon a computer program comprising program instructions, the computer program being loadable into a processing circuitry 102 and configured to cause execution of the method when the computer program is run by the at least one processing circuitry 102.

The person skilled in the art realizes that the present disclosure is not limited to the preferred embodiments described above. The person skilled in the art further realizes that modifications and variations are possible within the scope of the appended claims. Additionally, variations to the disclosed embodiments can be understood and effected by the skilled person in practicing the claimed disclosure, from a study of the drawings, the disclosure, and the appended claims.

What is claimed is:

1. A vehicle control system for optimizing the energy consumption of a vehicle over a vehicle lifetime, the vehicle control system comprises:
    a rechargeable electric battery;
    a mechanical component; and
    a processing circuitry configured to cause the vehicle control system to:
        determine a battery wear value of the rechargeable electric battery;
        determine a mechanical component wear value of the mechanical component; and
        determine a target temperature value of the rechargeable electric battery based on the battery wear value and the mechanical component wear value so that a lifetime value of the rechargeable electric battery meets a lifetime value of the vehicle.

2. The vehicle control system according to claim 1, wherein the processing circuitry is further configured to cause the vehicle control system to:
    determine the lifetime value of the rechargeable electric battery based on the current battery wear value or an expected battery wear value over time of the rechargeable electric battery.

3. The vehicle control system according to claim 1, wherein the processing circuitry is further configured to cause the vehicle control system to:
    determine a lifetime value of the mechanical component based on the current mechanical component wear value or an expected mechanical component wear value over time of the mechanical component.

4. The vehicle control system according to claim 1, wherein the mechanical component wear value is dependent on a movement of at least a part of the mechanical component during operation of the vehicle.

5. The vehicle control system according to claim 4 wherein the movement of the at least part of the mechanical component is a rotation movement and the mechanical component wear value is defined by the cumulative number of revolutions the at least part of the mechanical component has been rotating over time.

6. The vehicle control system according to claim 4, wherein the movement of the at least part of the mechanical component is a rotation movement and the mechanical component wear value is defined by the cumulative torque of the at least part of the mechanical component over time.

7. The vehicle control system according to claim 1, wherein the mechanical component is any of a gearbox, a shaft, a steering linkage component, a suspension component, an engine, an electrical motor, or a brake component.

8. The vehicle control system according to claim 1, wherein the mechanical component is a gearbox and the mechanical component wear value of the gearbox is dependent on the usage of the gearbox.

9. The vehicle control system according to claim 8 wherein the usage of the gearbox is defined by the cumulative number of revolutions over time, and the cumulative torque over time, of at least a part of the gearbox.

10. The vehicle control system according to claim 1, the vehicle control system further comprises:
    a temperature management system for the rechargeable electric battery configured to cool or heat the rechargeable electric battery dependent on the target temperature value.

11. The vehicle control system according to claim 1, wherein the lifetime value of the vehicle is represented by a lifetime value of the mechanical component.

12. A method for optimizing the energy consumption of a vehicle over a vehicle lifetime, the method comprising:
    determining a battery wear value of the rechargeable electric battery;
    determining a mechanical component wear value of the mechanical component; and
    determining a target temperature value of the rechargeable electric battery based on the battery wear value and the mechanical component wear value so that a lifetime value of the rechargeable electric battery meets a lifetime value of the vehicle.

13. The method according to claim 12, the method further comprising:
    determining a lifetime value of the rechargeable electric battery based on the current battery wear value or an expected battery wear value over time of the rechargeable electric battery; and
    determining a lifetime value of the mechanical component based on the current mechanical component wear value or an expected mechanical component wear value over time of the mechanical component.

14. A non-transitory computer readable medium, having stored thereon a computer program comprising program instructions, the computer program being loadable into a processing circuitry and configured to cause execution of the method according to claim 12 when the computer program is run by the at least one processing circuitry.

15. The method according to claim 12, wherein the lifetime value of the vehicle is represented by a lifetime value of the mechanical component.

* * * * *